(12) United States Patent
Liu

(10) Patent No.: US 9,953,774 B2
(45) Date of Patent: Apr. 24, 2018

(54) ELECTRONIC DEVICE FOR CONTROLLING HIGH-VOLTAGE WITH MULTIPLE LOW-VOLTAGE SWITCHES

(71) Applicant: Tao Liu, Markham (CA)

(72) Inventor: Tao Liu, Markham (CA)

( * ) Notice: Subject to any disclaimer, the term of this patent is extended or adjusted under 35 U.S.C. 154(b) by 284 days.

(21) Appl. No.: 14/753,312

(22) Filed: Jun. 29, 2015

(65) Prior Publication Data

US 2016/0379771 A1    Dec. 29, 2016

(51) Int. Cl.
| | |
|---|---|
| *H01H 85/46* | (2006.01) |
| *H01H 9/54* | (2006.01) |
| *H03K 17/725* | (2006.01) |
| *G06F 13/38* | (2006.01) |
| *G06F 13/40* | (2006.01) |

(52) U.S. Cl.
CPC ............ *H01H 9/54* (2013.01); *G06F 13/385* (2013.01); *G06F 13/4081* (2013.01); *H03K 17/725* (2013.01)

(58) Field of Classification Search
CPC ............ G06F 13/4081; G06F 13/4086; G06F 13/385; H03K 17/725; H01H 9/54; H01H 9/541; H01H 9/542; H01H 9/543; H01H 9/544
USPC ......................................................... 307/113
See application file for complete search history.

(56) References Cited

U.S. PATENT DOCUMENTS

| | | | | |
|---|---|---|---|---|
| 3,666,988 A * | 5/1972 | Bellis | ................... | H03K 17/725 307/116 |
| 5,189,417 A * | 2/1993 | Caldwell | ............ | H03K 17/9622 341/26 |
| 5,783,875 A * | 7/1998 | Jaros | .................... | H03K 17/962 307/116 |
| 6,169,379 B1 * | 1/2001 | Zhang | ................... | B60J 7/0573 318/280 |
| 2011/0298302 A1* | 12/2011 | Pitigoi-Aron | ............ | H01H 9/00 307/125 |
| 2014/0125973 A1* | 5/2014 | Uhr | ........................... | F41J 5/08 356/218 |
| 2015/0084434 A1* | 3/2015 | Mousavi | .................. | H01H 9/54 307/116 |

OTHER PUBLICATIONS

Data sheet of MC14538B, ON Semiconductor, Jul. 2014—Rev. 11.*

* cited by examiner

*Primary Examiner* — Patrick Chen
(74) *Attorney, Agent, or Firm* — Edgar Chana Law P.C.

(57) ABSTRACT

An electronic device is disclosed for controlling a high-voltage power source with multiple low-voltage switches. The electronic device includes a low-voltage DC power supply that allows for low-voltage wiring and components to be used to control the high-voltage power source using multiple low-voltage switches. The electronic device includes a single pulse generator that generates a pulse signal upon activation of any one of the multiple switches. The pulse signal activates a bistable circuit controller that is coupled the a high-voltage electronic switch to control high-voltage power to the load.

10 Claims, 2 Drawing Sheets

ELECTRONIC DEVICE FOR CONTROLLING HIGH-VOLTAGE WITH MULTIPLE LOW-VOLTAGE SWITCHES

FIELD

The present disclosure relates generally to an electronic device. More particularly, the disclosure relates to an electronic device for coupling a high-voltage source to a load that allows for cheaper wiring costs through the use of multiple low-voltage switches.

BACKGROUND

In present day building construction, the majority of the cost of wiring is for transmission of high voltage electricity (e.g. exceeding 110 volt alternating current). Switched high-voltage circuits for residential, commercial and industrial wiring all include a power source that connects the power source in a loop with the load and a switch. For example, in residential wiring a ceiling light is connected to a circuit breaker box for power and a switch for control that creates a long run of high-voltage wiring in the wiring loop. The length of wire used can vary greatly depending on the position of the switch and the number of switches used.

When multiple switches are used to control a single load, such as a ceiling light, each of the switches must also be connected to one another by high-voltage wiring. Also, when installing multiple switches for a single load, the switches themselves are more expensive and it becomes exponentially more difficult for each additional switch. For this reason, most residential wiring does not exceed using two three-way switches to control a single load.

Modern electrical wiring codes rate wiring material by the circuit voltage, temperature and environmental conditions. High-voltage wiring is required by code to have sufficient gauge and insulation to carry the required current and provide fire safety. Generally, this high-voltage wiring is a solid wire with a plastic insulation that is not very flexible. This makes the wiring expensive and the installation difficult. Low-voltage wiring code requirements by contrast allow for thinner wire and insulation because there is less safety risk with lower-voltage wiring.

SUMMARY

According to a first aspect, an electronic device is provided for coupling a high-voltage alternating current (AC) source to a load using a plurality of low-voltage switches. The electronic device comprises a low-voltage direct current (DC) power supply circuit coupled to the high-voltage AC source; a single pulse generator, an input of the single pulse generator coupled to the plurality of low-voltage switches to generate a pulse upon activation of any one of the plurality of low-voltage switches; a bistable circuit controller coupled to the single pulse generator, the bistable circuit controller toggling between an on-state and an off-state upon receiving the pulse from the single pulse generator; and a high-voltage electronic switch coupled to the bistable circuit controller, the high-voltage electronic switch connecting the high-voltage source to the load when the bistable circuit controller is in the on-state and disconnecting the high-voltage source from the load when the bistable circuit controller is in the off-state.

The single pulse generator can be coupled to the plurality of low-voltage switches using a cost efficient low-voltage wire gauge, and the load is coupled to the high-voltage AC source using a high-voltage wire gauge. The multiple low-voltage switches couple a low-voltage from the low-voltage DC power supply circuit to the single pulse generator upon activation of any one of the switches. The low-voltage switches can be biased momentary push button switches.

In some aspects, the single pulse generator can be implemented using a monostable flip-flop circuit, and the bistable circuit controller can be implemented as a bistable flip-flop circuit. The single pulse generator and bistable circuit controller can be implemented in separate integrated circuit packages. In other aspects, the single pulse generator and bistable circuit controller can be implemented together by a microcontroller.

The high-voltage source can be 120 VAC, such as in a residential application. The low-voltage DC power supply circuit can comprises a rectifier circuit, a filter, and a regulator. The high-voltage electronic switch is preferably a TRIAC or other semiconductor controlled switch.

BRIEF DESCRIPTION OF THE DRAWINGS

For a better understanding of the various embodiments described herein and to show more clearly how they may be carried into effect, reference will now be made, by way of example only, to the accompanying drawings which show at least one exemplary embodiment, and in which.

DESCRIPTION OF VARIOUS EMBODIMENTS

It will be appreciated that for simplicity and clarity of illustration, where considered appropriate, numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementations of various embodiments described herein.

The embodiments of the systems, devices and methods described herein may be implemented in hardware or software, or a combination of both. Some of the embodiments described herein may be implemented in computer programs executing on programmable computers, each computer comprising at least one processor, a computer memory (including volatile and non-volatile memory), at least one input device, and at least one output device. For example, and without limitation, the programmable computers may be a simple microprocessor with on-chip memory and A/D converters. Program code may operate on input data to perform the functions described herein and generate output data.

Figure 1:
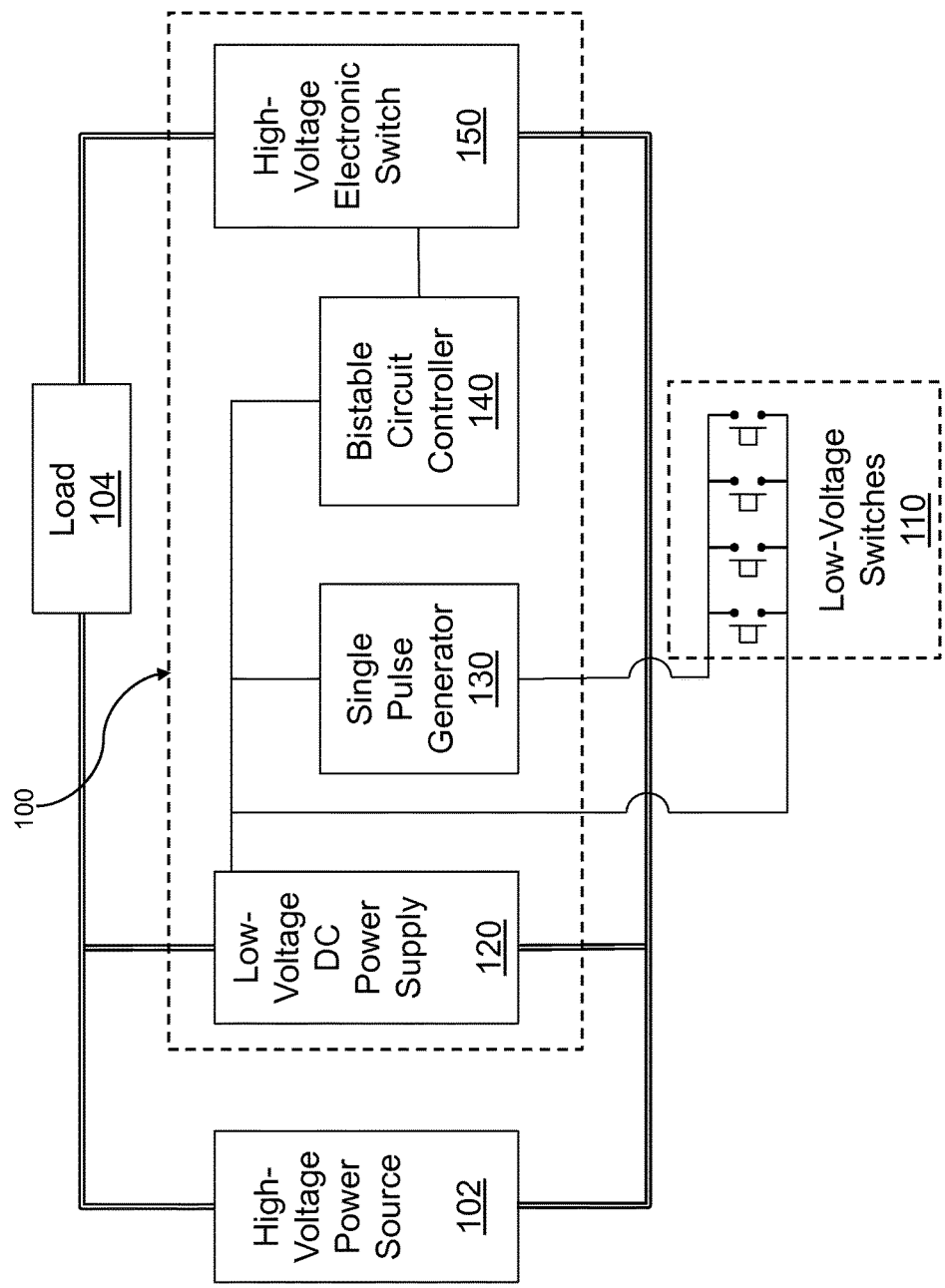
FIG. 1 is a block diagram of an electronic device for coupling a high-voltage source to a load using multiple low-voltage switches.

Reference is first made to FIG. 1, shown is a block diagram of an electronic device 100 for coupling a high-voltage power source 102 to a load 104 using multiple low-voltage switches 110. A high-voltage electronic switch 150 is controlled by low-voltage switches 110 through a single pulse generator 130 and a bistable circuit controller 140 to determine whether to couple the load 104 to the high voltage power source 102. For example, in the residential wiring context, load 104 can include a one or more ceiling lights that are coupled to a breaker box of the home using high-voltage wiring and electronic device 100 is coupled to multiple low-voltage switches 110 to control turning the ceiling lights on or off.

Components of electronic device 100 can be placed in a single housing and can be positioned anywhere along the high-voltage wiring that completes the circuit between load 104 and high-voltage power source 102. This can simplify the high voltage wiring between the load 104 and high-voltage power source 102 because the wiring run does not require incorporating a high-voltage switch. Some embodiments of electronic device 100 can also include at least one low-voltage switch and provide a connection for coupling additional low-voltage switches 110. This embodiment may be suitable for retrofitting applications where a traditional high-voltage switch can be replaced with the embodiment including the switch and also allow further low-voltage wiring to other switches to control the same load. Other embodiments of electronic device 100 can be positioned at or near the high-voltage power source or distribution point, such as a breaker box.

High-voltage power source 102 is coupled to a low-voltage direct current (DC) power supply 120 that provides a low-voltage power supply to the low power components of electronic device 100. Converting to a low-voltage DC supply allows for thinner gauge wiring to be used to couple the low-voltage components of electronic device 100 and low-voltage switches 110. The low voltage components comprise a single pulse generator 130 and a bistable circuit controller 140.

In residential embodiments, high-voltage power source 102 is typically the alternating current (AC) mains electricity provided by the power line at 120 Volts at 60 cycles per second in North America. High-voltage power source 102 can also refer to the distribution point of power for the building, or internal unit, such as a breaker box/panel where the power feed is distributed into subsidiary circuits. Other embodiments can have a different high-voltage power characteristics depending on the jurisdiction and application. For example, in the industrial or commercial context high voltage levels can be used and high-voltage power source 102 can be three-phase power. Some embodiments of electronic device 100 can be configured to function with different voltages, frequencies and multiples phases.

The term high-voltage power source 102 is used to distinguish from low-voltage DC power supply 120 that provides a low-voltage power supply to single pulse generator 130 and bistable circuit controller 140. The term high voltage is used to distinguish from the low-voltage power that could not be transmitted over low-voltage wiring. FIG. 1 uses a double line to indicate high-voltage wiring and a single line to indicate low-voltage wiring. The distinction between high and low voltage is made based upon the gauge of wiring required by various building codes. Low voltage wiring is thinner and the building code requirements are less stringent which allows low-voltage wiring to be deployed at a much lower cost to traditional high-voltage wiring. There is also less risk of fire because the length of high voltage wiring can be reduced through the use of electronic device 100.

Single pulse generator 130 can be coupled to multiple low-voltage switches 110 that are used to control application of high voltage power source 102 to load 104. Electronic device 100 can use any number of low-voltage switches 110 because unlike traditional wiring, multiple runs of high-voltage wiring are not required to include each switch into the circuit. Upon activation of any one of the low-voltage switches 110, single pulse generator 130 provides a pulse signal to bistable circuit controller 140.

Bistable circuit controller 140 toggles between an on-state and an off-state upon receiving the pulse signal from single pulse generator 130. In the on-state, bistable circuit controller 140 provides a signal to high-voltage electronic switch 150 to connect the load 104 to high-voltage power source 102. In the off-state, bistable circuit controller 140 provides a signal to high-voltage electronic switch 150 to disconnect the load 104 to high-voltage power source 102.

High-voltage electronic switch 150 is a high-voltage switching device that is controlled by a low-voltage signal from bistable circuit controller 140. High-voltage electronic switch 150 can be a solid-state relay that controls the power circuit without moving parts. Preferably, a bidirectional triode thrysistor, or TRIAC, is used to provide this functionality in a low-cost and small footprint package.

Low-voltage DC Power Supply 120 comprises a rectifier circuit, a filter, and a regulator. A skilled person in the art can implement low-voltage DC power supply 120 in a number of ways. For example, the rectifier circuit can be a full-wave or half-wave rectifier; the filter portion can be implemented with a capacitor to remove AC ripple; and the regulator can be implemented using an integrated circuit regulator or a zener diode as a shunt regulator.

Single pulse generator 130 can be implemented using a flip-flop circuit or a microcontroller. Single pulse generator 130 can act as a filter to prevent rapidly toggling any of the switches, as well as to provide debouncing to prevent any spurious signals.

Bistable circuit controller 140 can be implemented as a flip-flop or as part of a microcontroller along with single pulse generator 130. The state of bistable circuit controller 140 is toggled upon receiving a pulse from single pulse generator. In a microcontroller implementation that combines single pulse generator 130 and bistable circuit controller 140, software can be executed by the microcontroller to interpret the signal from switches provided to an input of the microcontroller in order to generate a microcontroller output that triggers high-voltage electronic switch 150. In this embodiment, software modules can provide the separate functionality of single pulse generator 130 and bistable circuit controller 140.

Low-voltage switches 110 are preferably biased momentary switches that when pressed makes contact and when the button is released the contact is broken. FIG. 1 illustrates multiple momentary push-button switches connected in parallel between low-voltage DC power supply 120 to single pulse generator 130. Other embodiments can use different types of switches but this may necessitate more complexity in wiring multiple switches and processing the switch signals. The circuit to couple low-voltage switches 110 to single pulse generator 130 can include a debouncing circuit or low-pass filter.

Figure 2:
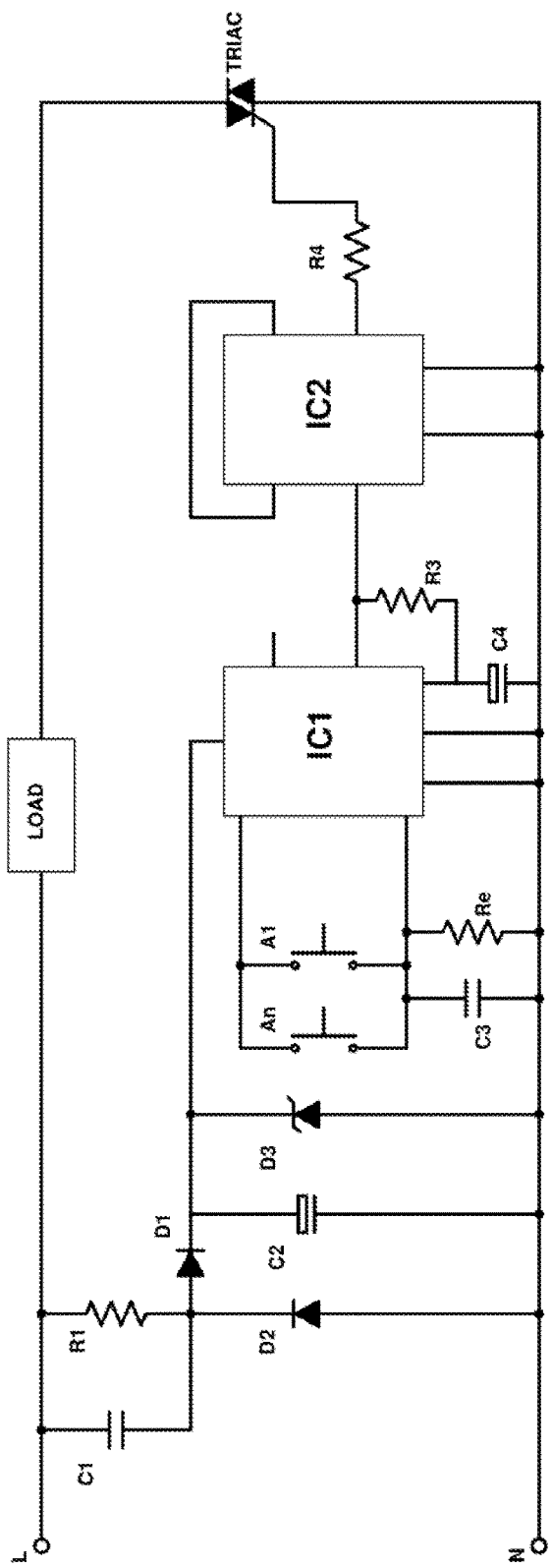
FIG. 2 is a circuit diagram of an embodiment of the electronic device of FIG. 1.

Referring now to FIG. 2, shown is a circuit diagram 200 of an embodiment of the electronic device 100 of FIG. 1. In this embodiment low-voltage DC power supply 120 is comprised of diodes D1 and D2 to provide full-wave rectification of the high-voltage AC power; Capacitor C2 filters the rectifier output to reduce the variation in the output voltage from D1 and D2; Zener diode D3 provides voltage regulation to provide a stable DC output voltage.

Low-voltage switches $A_1$ to $A_N$ can be implemented as multiple momentary push-button switches and can be coupled between the DC output voltage and the neutral line.

When pressed the push button switches connect the DC supply voltage to neutral through capacitor C3 and resistor Re. Capacitor C3 and resistor Re provide a low-pass debounce filter for the low-voltage switches.

Single pulse generator 130 can be implemented in a packaged integrated circuit, labelled as $IC_1$ in FIG. 2. For example, $IC_1$ can be flip-flop configured as a monostable trigger that sends a signal to $IC_2$ upon receiving a signal from any one of the switches. Bistable circuit controller 140 can also be implemented in a packaged integrated circuit, labelled as $IC_2$ in FIG. 2. For example, $IC_2$ can be implemented as a bistable flip-flop that toggles its output upon receiving a signal from $IC_1$. Output from $IC_1$ can be filtered, such as by R3 and C4 as shown in FIG. 2 that is provided as an input to $IC_2$. The high-voltage electronic switch 150 can be implemented as a TRIAC in the circuit shown in FIG. 2. The output from $IC_2$ can be provided through resistor R4 to provide a sufficient signal to trigger the TRIAC.

While the exemplary embodiments have been described herein, it is to be understood that the invention is not limited to the disclosed embodiments. The invention is intended to cover various modifications and equivalent arrangements included within the spirit and scope of the appended claims, and scope of the claims is to be accorded an interpretation that encompasses all such modifications a 2nd equivalent structures and functions.

The invention claimed is:

1. An electronic device for coupling a high-voltage alternating current (AC) source to a load using a plurality of low-voltage switches, the device comprising:
   a low-voltage direct current (DC) power supply circuit coupled to the high-voltage AC source;
   a single pulse generator comprising a monostable flip-flop circuit, an input of the single pulse generator coupled to the plurality of low-voltage switches, the single pulse generator generates a pulse upon activation of any one of the plurality of low-voltage switches, each of the plurality of low-voltage switches connected in parallel to the input;
   a bistable circuit controller coupled to the single pulse generator, the bistable circuit controller toggling between an on-state and an off-state upon receiving the pulse from the single pulse generator; and
   a high-voltage electronic switch coupled to the bistable circuit controller, the high-voltage electronic switch connecting the high-voltage source to the load when the bistable circuit controller is in the on-state and disconnecting the high-voltage source from the load when the bistable circuit controller is in the off-state.

2. The electronic device of claim 1 wherein the single pulse generator is coupled to the plurality of low-voltage switches using a low-voltage wire gauge, and wherein the load is coupled to the high-voltage AC source using a high-voltage wire gauge.

3. The electronic device of claim 1 wherein the plurality of low-voltage switches couple a low-voltage from the low-voltage DC power supply circuit to the single pulse generator.

4. The electronic device of claim 3 wherein the plurality of low-voltage switches are biased momentary push buttons.

5. The electronic device of claim 1 wherein the bistable circuit controller is a bistable flip-flop circuit.

6. The electronic device of claim 1 wherein the single pulse generator and bistable circuit controller are implemented in separate integrated circuit packages.

7. The electronic device of claim 1 wherein the single pulse generator and bistable circuit controller are implemented by a microcontroller.

8. The electronic device of claim 1 wherein the high-voltage source is a 120 VAC residential power supply.

9. The electronic device of claim 1 wherein the low-voltage DC power supply circuit comprises a rectifier circuit, a filter, and a regulator.

10. The electronic device of claim 1 wherein a high-voltage electronic switch is a TRIAC.

* * * * *